United States Patent
Yeh et al.

(10) Patent No.: US 7,354,856 B2
(45) Date of Patent: Apr. 8, 2008

(54) METHOD FOR FORMING DUAL DAMASCENE STRUCTURES WITH TAPERED VIA PORTIONS AND IMPROVED PERFORMANCE

(75) Inventors: Ming-Shih Yeh, Hsinchu (TW); Ming-Hsing Tsai, Taipei (TW); Shau-Lin Shue, Hsinchu (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 405 days.

(21) Appl. No.: 11/071,104

(22) Filed: Mar. 4, 2005

(65) Prior Publication Data

US 2006/0199379 A1    Sep. 7, 2006

(51) Int. Cl.
*H01L 21/44*    (2006.01)
(52) U.S. Cl. .................. 438/638; 438/640; 438/673; 438/713; 438/978; 257/E21.579
(58) Field of Classification Search .............. 438/638, 438/640, 673, 713, 978, FOR. 458; 257/E21.579
See application file for complete search history.

(56) References Cited

U.S. PATENT DOCUMENTS 6,251,774 B1 * 6/2001 Harada et al. ............. 438/637
6,933,240 B2 * 8/2005 Lazar et al. ............... 438/710

FOREIGN PATENT DOCUMENTS

JP        2002-280450        9/2002

* cited by examiner

*Primary Examiner*—Michelle Estrada
(74) *Attorney, Agent, or Firm*—Birch, Stewart, Kolasch & Birch, LLP

(57) ABSTRACT

The manufacture of damascene structures having improved performance, particularly, but not by way of limitation, dual damascene structures is provided. In one embodiment, a substrate having a conductive layer is formed in a first insulating layer. A protective layer is formed above the conductive layer. An etching stop layer is formed above the protective layer and the first insulating layer. A second insulating layer is formed above the etching stop layer. A first patterned photoresist layer is formed above the second insulating layer, the first patterned photoresist layer having a first pattern. The first pattern is etched into the second insulating layer and the etching stop layer to form a first opening. A via plug is filled at least partially in the first opening. An anti-reflective coating (ARC) layer is formed above the second insulating layer. A second patterned photoresist layer is formed above the ARC layer, the second photoresist layer having a second pattern. The second pattern is etched into portions of the via plug, second insulation layer, and the ARC layer to form a second opening, wherein a substantially tapered sidewall portion is formed at the interface of the first and second openings.

11 Claims, 5 Drawing Sheets

METHOD FOR FORMING DUAL DAMASCENE STRUCTURES WITH TAPERED VIA PORTIONS AND IMPROVED PERFORMANCE

BACKGROUND OF THE INVENTION

1. Field of the Invention

The present invention relates generally to the fabrication of semiconductor devices, and more particularly, to methods for forming dual damascene structures with tapered via portions and improved performance.

2. Brief Discussion of the Related Art

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron interlayer and intralayer interconnects have increasingly high aspect ratios. In particular, high aspect ratio vias require uniform etching profiles including preventing formation of unetched residues around the via openings during anisotropic etching of an overlying trench structure in a dual damascene formation process.

In a typical dual damascene process, via openings are first etched into an insulating layer also known as an inter-metal or inter-level dielectric (IMD/ILD) layer. The insulating layer is typically formed over a metal or conductive layer. After a series of photolithographic steps defining via openings and trench openings, the via openings and the trench openings are filled with a metal (e.g. Cu) to form vias and trench lines, respectively. The excess metal above the trench level is then removed and the uppermost layer planarized usually by a chemical-mechanical polishing (CMP) process.

One shortcoming of the above approach during the formation of the via and trench openings is punchthrough. Typically in dual damascene processing, etching stop layers and via plugs are formed in the dual damascene structure to prevent punchthrough that may occur during the anisotropic etching of the insulating layer to form the via and trench openings. If etching of the insulating layer continues into the metal layer, the metal will be exposed and there may be metal oxidation leading to device failure. With many variables involved, it has proven difficult to achieve consistent etching results. For this reason, in the conventional dual damascene methods, high thickness and/or low etch rate via plugs are typically formed in the via openings to prevent the punchthrough phenomenon.

Another drawback and a recurring problem affecting the anisotropic etching of sub-micron dual damascene features, particularly with respect to the trench portion etching process has been the formation of photoresist residues (also referred to as scum) leading to via fences. These residues frequently remain on via sidewalls detrimentally affecting subsequent etching profiles. For example, during anisotropic etching of a trench opening overlying one or more vias, residual photoresist interacting with the IMD layer at the via sidewall produces an etching resistant residue surrounding the via opening following trench etching. The via fence detrimentally affects subsequent processes, for example, by reducing adhesion of deposited overlayers, for example barrier layers and metal filling layers which degrades electrical performance and device reliability.

For example, referring to FIG. 1 is shown a dual damascene structure following trench etching which shows metal layer 8, etching stop layer 10, IMD layer 12A, IMD layer 12B, and photoresist layer 14. For example, via opening 16A is first formed by a first conventional photolithographic patterning and etching process followed by formation of an overlying trench opening 16B by a similar second photolithographic patterning and etching process. Following trench etching, an etching resistant via fence 22 is formed surrounding the via opening 16A.

For these reasons and other reasons that will become apparent upon reading the following detailed description, there is a need in the semiconductor processing art to develop a method or methods to reliably etch dual damascene structures to at least avoid via fences and have improved electrical performance.

SUMMARY OF THE INVENTION

The present invention is directed to the manufacture of damascene structures having improved performance, particularly, but not by way of limitation, to dual damascene structures. In one embodiment, a substrate having a conductive layer is formed in a first insulating layer. A protective layer is formed above the conductive layer. An etching stop layer is formed above the protective layer and the first insulating layer. A second insulating layer is formed above the etching stop layer. A first patterned photoresist layer is formed above the second insulating layer, the first patterned photoresist layer having a first pattern. The first pattern is etched into the second insulating layer and the etching stop layer to form a first opening. A via plug is filled at least partially in the first opening. An anti-reflective coating (ARC) layer is formed above the second insulating layer. A second patterned photoresist layer is formed above the ARC layer, the second photoresist layer having a second pattern. The second pattern is etched into portions of the via plug, second insulation layer, and the ARC layer to form a second opening, wherein a substantially tapered sidewall portion is formed at the interface of the first and second openings.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present invention, and in which.

DETAILED DESCRIPTION OF THE PREFERRED EMBODIMENTS

In the following description, numerous specific details are set forth to provide a thorough understanding of the present invention. However, one having an ordinary skill in the art will recognize that the invention can be practiced without these specific details. In some instances, well-known processes and structures have not been described in detail to avoid unnecessarily obscuring the present invention.

Reference will now be made in detail to the present preferred embodiments of the present invention, examples of which are illustrated in the accompanying drawings.

Figure 1:
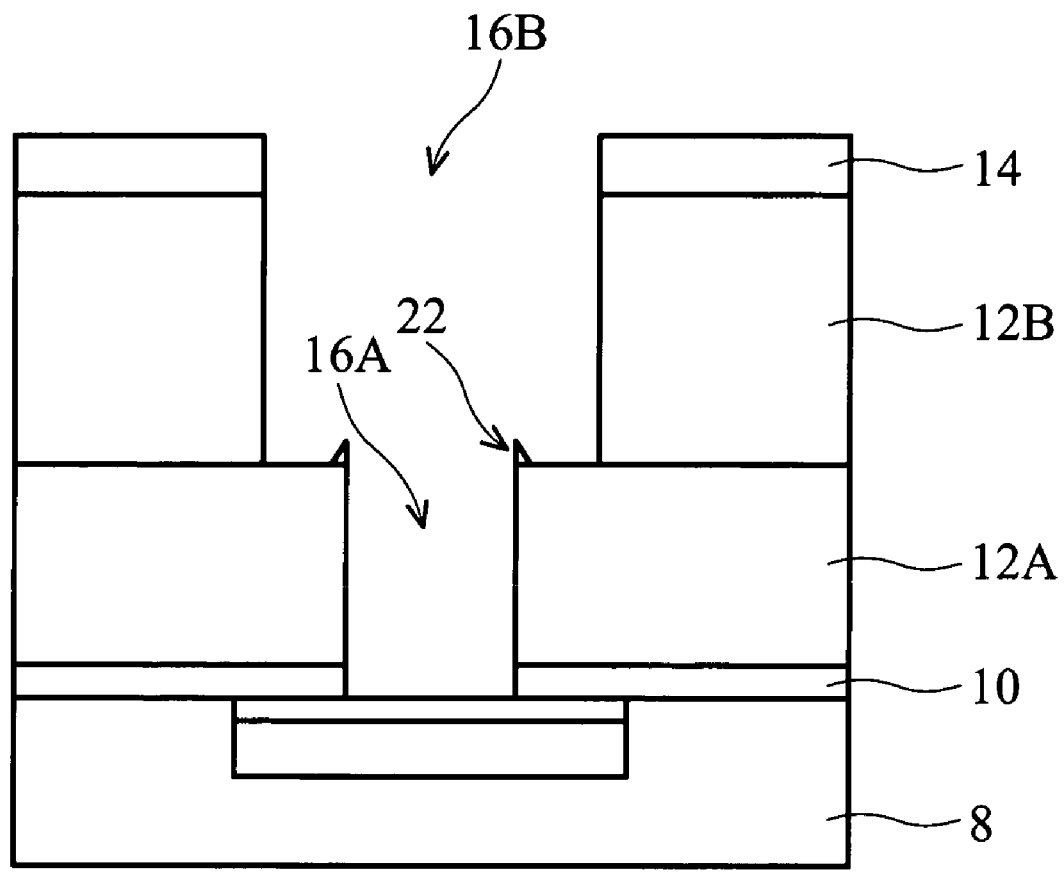
FIG. 1 is a cross-sectional view of a dual damascene structure at a stage in manufacturing according to the prior art.
Figure 2A:
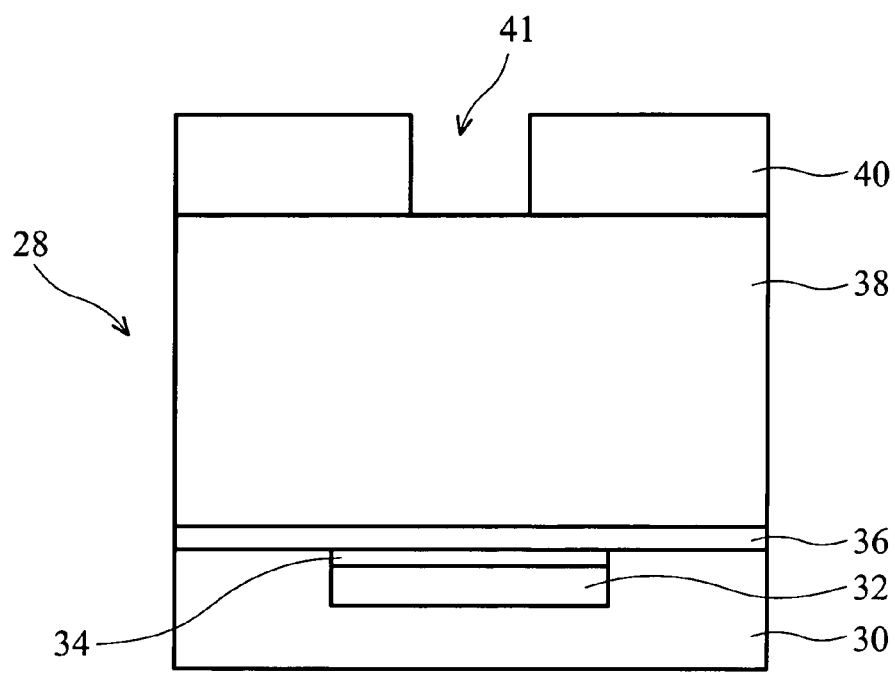
FIG. 2A-2G are cross-sectional views of a portion of a multilayer semiconductor device at stages in a dual damascene manufacturing process according to one embodiment of the present invention.

FIG. 2A is a cross-sectional view of a portion of a multilayer semiconductor device included in a semiconductor wafer showing a substrate 28 for creating for example, a via in a dual damascene structure at a stage in the manufacturing process. The substrate 28 includes a first insulating layer 30 with, for example, a conductive layer 32 formed therein. After conductive layer 32 is planarized by a chemical mechanical planarization process for example, a protective layer 34 is formed overlying conductive layer 32. Protective layer 34 may in one embodiment of the present invention be formed to a thickness of about 50 Angstroms to about 300 Angstroms and be an electroless metal layer and may include, for example, cobalt alloy with tungsten and phosphorous (CoWP), cobalt alloy with tungsten and boron (CoWB), cobalt alloy with molybdenum and phosphorous (CoMoP), cobalt alloy with molybdenum and boron (CoMoB), nickel alloy with tungsten and phosphorous (NiWP), and nickel alloy with boron and phosphorous (NiBP), The protective layer 34 functions as a protective layer against punchthrough that may occur during the etching of a subsequently formed IMD layer to form via and trench openings. Typically in the prior art process of etching the IMD layer to form the trench opening, a via plug is formed to protect the underlying conductive layer. However, it has proven difficult to achieve consistent etching results and frequently, the via plug may be etched through to expose the conductive layer 32 below leading to metal oxidation and ultimately device failure. For this reason, an aspect of the present invention utilizes a protective layer formed between the conductive layer 32 and an etch stop layer to prevent the occurrence of punchthrough; and as will be explained further below, the use of high thickness and/or low etch rate plugs and/or anti-reflective coating (ARC) layers formed in the via openings may no long be necessary.

Overlying the first insulator layer 30 and the protective layer 34 is typically formed an etching stop layer 36 which may include a nitride or carbide material, for example, silicon nitride (e.g., $Si_3N_4$), silicon carbide (e.g., SiC), or silicon oxynitride (e.g., SiON). The etching stop layer 36 is typically deposited by a chemical vapor deposition (CVD) process including for example, PECVD (plasma enhanced CVD), LPCVD (low pressure CVD), or HDPCVD (high density plasma CVD) under conditions that are well known in the art. A typical thickness of the etching stop layer 36, for example, may be between about 0 and 500 Angstroms.

Overlying the etching stop layer 36 is an inter-metal dielectric (IMD) layer 38 (insulating layer) for subsequently etching a semiconductor feature, for example, a via opening, the IMD layer 38 being formed of, for example, silicon dioxide, or a low-k doped silicon dioxide. Typically, the dielectric constant of the low-k material is less than about 3.0 to minimize electrical parasitic capacitive effects. It will be appreciated that other low-k materials may be used and that the method according to the present invention is likewise applicable to those materials, particularly if they are porous materials. Additional exemplary low-k inorganic materials include, for example, doped and undoped porous oxides, xerogels, or SOG (spin-on glass). Exemplary low-k organic materials include, for example, polysilsesquioxane, parylene, polyimide, benzocyclobutene, amorphous Teflon, and spin-on polymer (SOP). In one embodiment of the present invention, the dual damascene structure is formed in a single IMD layer 38, of, for example, a carbon doped silicon dioxide, also referred to as organo silicate glass (OSG). Several commercially available formulations are available for producing the low-k carbon doped oxide, for example, known as SILK™ and BLACK DIAMOND™ according to conventional PECVD processes. Typically, the IMD layer is formed having a thickness of about 2,500 to about 12,500 Angstroms.

Overlying the IMD layer 38 may be an optional second etching stop layer (not shown) formed of, for example, a nitride or carbide including silicon nitride, silicon carbide, or silicon oxynitride. The etching stop layer functions as a hard mask for controlling the etching profile of a subsequently etched via opening. Optionally formed over the second etching stop layer may be an anti-reflective coating (ARC) layer (not shown) to reduce light reflectance in a subsequent photolithographic patterning step of subsequently deposited first photoresist layer 40. The optional ARC layer may be a silicon oxynitride layer, for example.

Still referring to FIG. 2A, the first photoresist layer 40 with a thickness of about 2,000 to about 4,000 Angstroms is photolithographically patterned by conventional means to define an etching hole 41, for example a via pattern overlying and exposing the IMD layer 38 for etching a via opening. The first photoresist layer 40 may include a conventional photoresist layer exposed at conventional UV wavelengths (e.g. 250-400 nm) or may be a single or bi-layer resist used for example, in deep ultraviolet (DUV) patterning using wavelengths of less than about 250 nm n.

Figure 2B:
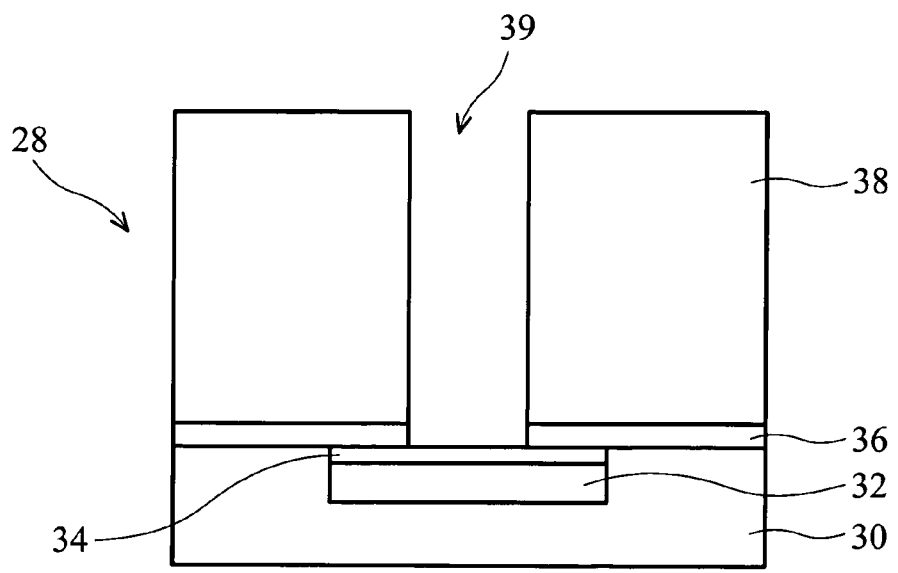

Following patterning of the first photoresist layer 40 to form a portion, e.g., etching hole 41, a plasma etching process also known as a reactive ion etching (RIE) process may be carried out using a conventional plasma etching chemistry. For example, an etching chemistry including fluorocarbons and/or hydrofluorocarbons, oxygen, and nitrogen may be optimized to anisotropically etch through the IMD layer 38 to the etching stop layer 36. Plasma etching is then carried out to etch through the etching stop layer 36 to form opening 39, for example a via opening, in closed communication with protective layer 34 as shown in FIG. 2B after stripping the first photoresist layer 40. Protective layer 34 prevents the etching from continuing into the conductive layer 32 thus avoiding punchthrough.

Figure 2C:
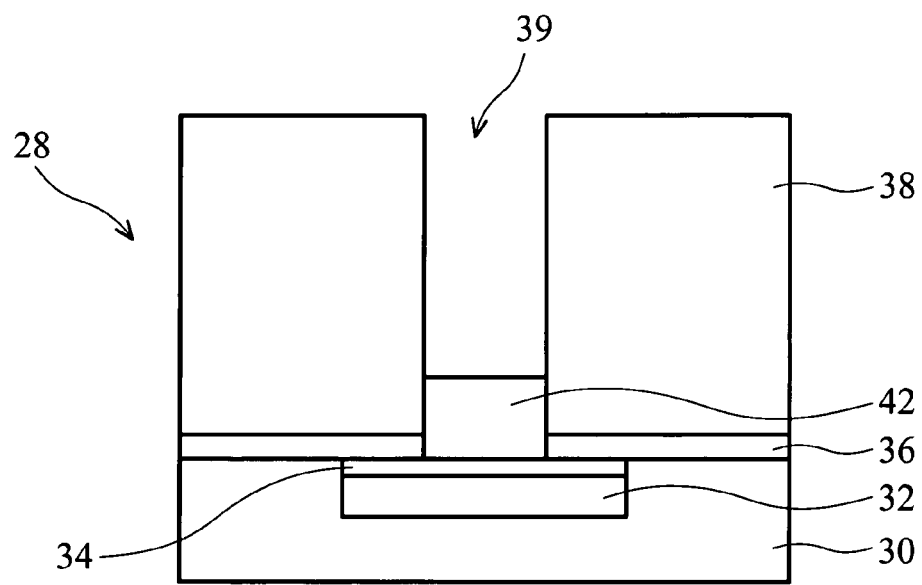

Referring to FIG. 2C, following the anisotropically etching to form via opening 39, a polymer or a resinous material layer such as an I-line photoresist, or novolac (novolak) resin is blanket deposited by a spin-coating process to fill via opening 39 followed by a thermal and/or ultraviolet radiative curing process to initiate polymeric cross linking reactions and/or to drive off solvents. The level of a via plug 42 is preferably controlled by an etchback process including, for example an oxygen containing plasma to remove deposited via plug material from the semiconductor surface and to adjust the level of the via plug 42 to partially fill the via opening 39 to a desired level. In the prior art methods of forming dual damascenes, the via plugs used typically have high thickness and/or low etch rate to avoid punchthrough of the underlying conductive layer 32. They are typically filled from about ⅓ to about ¾, and typically ½ of the via opening depth. However, because an aspect of the present invention uses a protective layer 34 protecting conductive layer 32 in the formation of the trench opening, there is less of a concern that the conductive layer 32 may be etched through leading to punchthrough. Consequently, in the present invention low thickness and/or high etch rate via plugs may be used in the formation of the trench openings. Furthermore, the use of low thickness and/or high etch rate via plugs is advantageous because if the via plug etches faster than the surrounding IMD layer, the formation of residues or fences will be substantially reduced, as will be explained further below. In one embodiment, via plug 42 is filled from about ⅛ to about ½, more preferably about ⅓ of the via opening 39 depth.

Figure 2D:
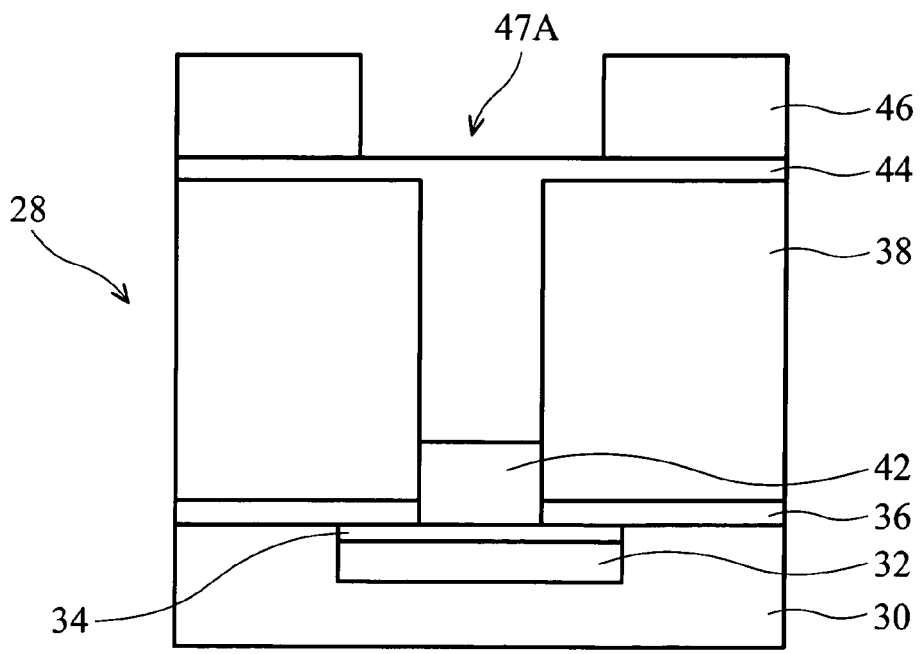

Following the formation of via plug 42, FIG. 2D shows an anti-reflective coating (ARC) layer 44, such as a bottom anti-reflective coating layer (BARC) formed over the via plug 42 and portions of the IMD layer 38. In the prior art methods of dual damascene formation, low etch rate and/or high thickness ARC layers were typically used to prevent the likely occurrence of punchthrough. Because an aspect of the present invention uses a protective layer 34 protecting conductive layer 32 in the formation of the trench opening, there is less of a concern that the conductive layer 32 will be etched through leading to punchthrough. Consequently, in the present invention a high etch rate and/or low thickness ARC layer 44 may be used in the formation of the dual damascene structure. ARC layer 44 may be deposited, for example, by an LPCVD process, having a thickness of about 200 Angstroms to about 800 Angstroms. ARC layer 44 is formed to reduce undesired light reflections from an underlying layer, such as IMD layer 38 for example during a photolithographic patterning process.

Figure 2E:
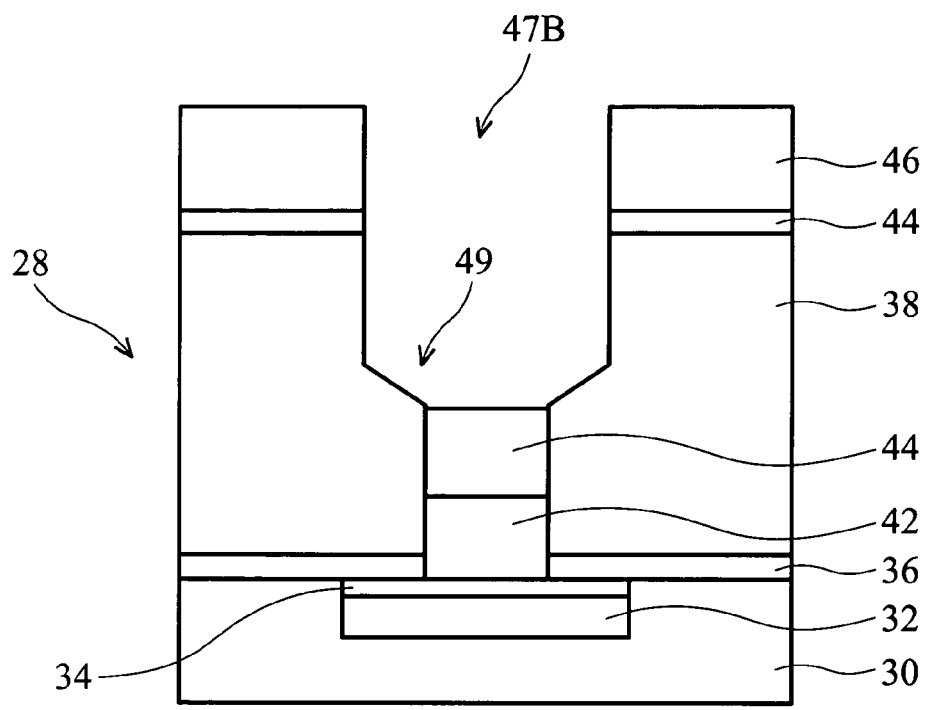

Following the deposition of ARC layer 44, a second photoresist layer 46 is deposited over ARC layer 44 for photolithographically patterning the uppermost surface with opening 47A for etching a trench opening. For example, as shown in FIG. 2E, a plasma anisotropic etching process (RIE) is carried out to etch through portions of the ARC layer 44 to include partially etching through the IMD layer 38 thereby forming trench opening 47B. It will be appreciated that the trench opening pattern may encompass more than one via opening, e.g., via opening 39. FIG. 2E shows the formation of a tapered via opening sidewall portion 49 in remaining via opening 39. The formation of the tapered profile is due to the etching rate of the ARC layer 44 being greater than the etching rate of the IMD Layer 38. It has been found, according to exemplary embodiments of the present invention that the tapered via opening sidewall portion 49 has no detrimental effect on electrical performance, rather electrical performance is comparable to the electrical performance of substantially vertical vias having no polymer residue defects. Advantageously, electro-migration resistance was determined to be improved compared to prior art method of dual damascene formation. In addition, the coverage of a copper seed layer by PVD was found to have improved coverage and an improved electrodeposition metal filing process filling the dual damascene structure with a void free copper layer.

Figure 2F:
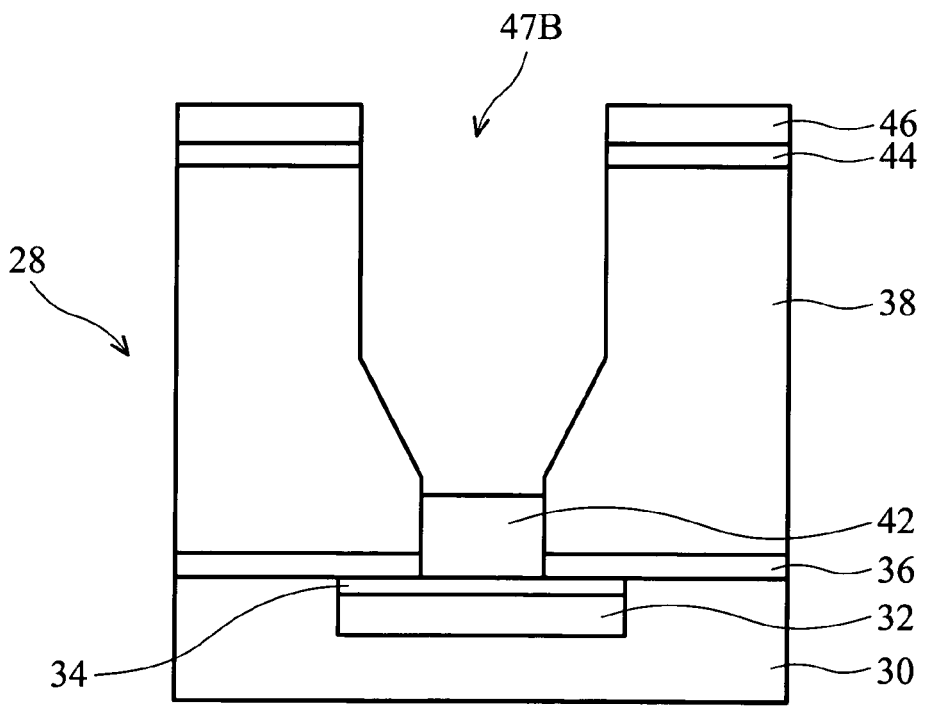

FIG. 2F shows a cross-sectional view of the dual damascene structure following further anisotropic etching of the IMD layer 38 including via plug 42, the removal of ARC layer 44, and a more pronounced tapered via opening sidewall portion due in part to the higher etch rate of ARC layer 44 and/or via plug 42 compared to the etch rate of IMD layer 38.

Figure 2G:
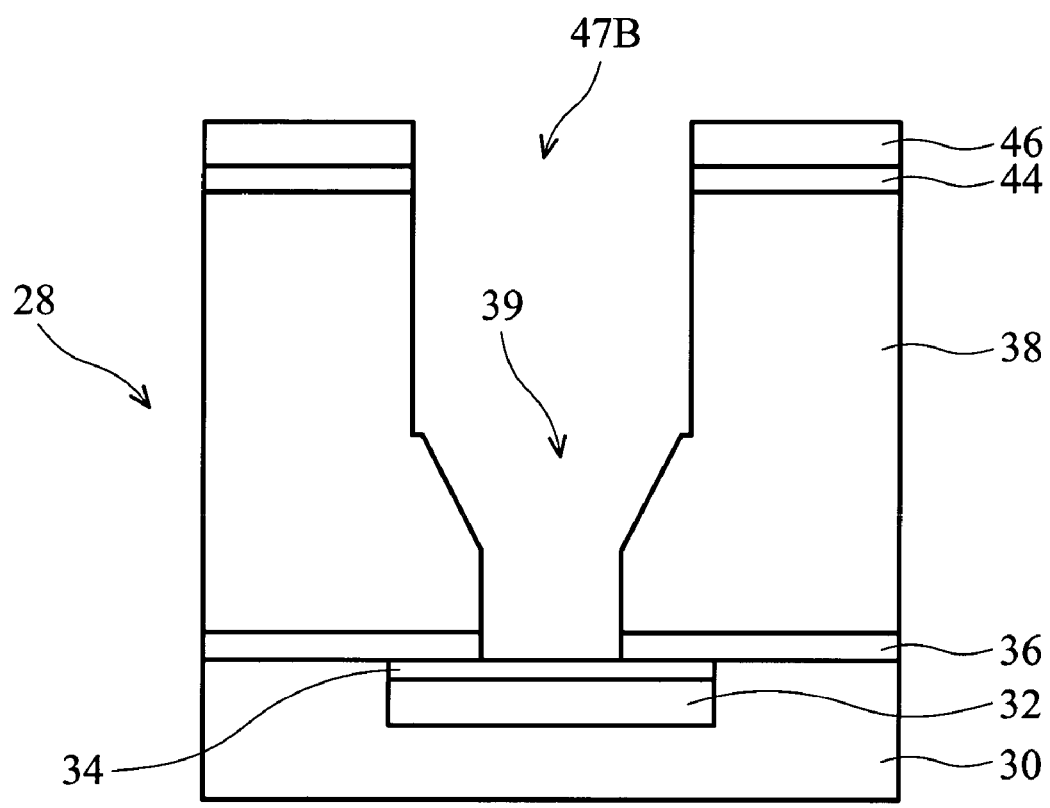

Referring to FIG. 2G, following the trench etching process a conventional oxygen ashing process is carried out to remove the remaining via plug 42 to expose protective layer 34. In the prior art dual damascene formation processes, IMD layer and/or photoresist residues or via fences are typically formed at the interface of the trench and via openings because the low-k IMD layer etches faster than the via plug. However, because high etch rate plugs may be used, an aspect of the present invention shows a substantial reduction in the formation these via fences.

Although not shown, the dual damascene structure is then completed according to conventional processes. For example, the remaining photoresist and ARC layers are removed, the dual damascene opening is filled with a metal, for example, copper according to an electrodeposition process followed by a CMP process to remove excess copper above the trench opening to complete the formation of a dual damascene. Prior to electrodeposition of copper, a barrier/adhesion layer of, for example, tantalum nitride, may be blanket deposited to line the dual damascene structure, followed by deposition of a copper seed layer to provide an electrodeposition surface. During the subsequent CMP process the process surface is planarized above the trench opening to complete the formation of the dual damascene structure.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming a damascene structure, comprising:

providing a substrate having a conductive layer formed in a first insulating layer;

forming a protective layer above the conductive layer;

forming an etching stop layer above the protective layer and the first insulating layer;

forming a second insulating layer above the etching stop layer;

forming a first patterned photoresist layer above the second insulating layer, the first patterned photoresist layer having a first pattern;

etching the first pattern into the second insulating layer and the etching stop layer to form a first opening;

at least partially filling the first opening with a via plug;

forming an anti-reflective coating (ARC) layer above the second insulating layer;

forming a second patterned photoresist layer above the ARC layer, the second photoresist layer having a second pattern; and etching the second pattern into portions of the via plug, second insulation layer, and the ARC layer to form a second opening, wherein a tapered sidewall portion is formed at the interface of the first and second openings.

2. The method of claim 1, wherein the protective layer is a material selected from the group consisting of CoWP, CoWB, CoMoP, CoMoB, NiWP, and NiBP.

3. The method of claim 1, wherein the protective layer is formed to a thickness of about 50 Angstroms to about 300 Angstroms.

4. The method of claim 1, wherein the second insulating layer is a material selected from the group consisting of silicon oxide, doped silicon dioxide, porous oxides, xerogels, SOG (spin on glass), polysilsesquioxane, parylene, polyimide, benzocyclobutene, amorphous polytetrafluoroethylene, and spin-on polymer (SOP).

5. The method of claim 1, wherein the first opening comprises a via opening and the second opening comprises a trench opening to form a dual damascene structure.

6. The method of claim 1, further comprising removing the first patterned photoresist layer subsequent to the step of etching the first pattern.

7. The method of claim 1, wherein the via plug is a material selected from the group consisting of a resinous polymer and a photosensitive resinous polymer.

8. The method of claim 1, wherein the via plug is filled to a level in the first opening from about ⅛ to about ½ of the depth of the first opening.

9. The method of claim 1, wherein in the step of etching the second pattern, the etch rate of the via plug and/or the ARC layer is greater than the etch rate of the second insulating layer.

10. The method of claim 1, wherein following the step of etching the second pattern, the first opening is substantially free of an etching resistant etching residue protruding at an interface of the first and second openings.

11. The method of claim 1, further comprising removing the second patterned photoresist layer, the ARC layer, and the via plug subsequent to the step of etching the second pattern.

* * * * *